US005509132A

United States Patent [19]
Matsuda et al.

[11] Patent Number: 5,509,132
[45] Date of Patent: Apr. 16, 1996

[54] SEMICONDUCTOR MEMORY DEVICE HAVING AN SRAM AS A CACHE MEMORY INTEGRATED ON THE SAME CHIP AND OPERATING METHOD THEREOF

[75] Inventors: Yoshio Matsuda; Kazuyasu Fujishima; Hideto Hidaka; Mikio Asakura, all of Hyogo, Japan

[73] Assignee: Mitsubishi Denki Kabushiki Kaisha, Tokyo, Japan

[21] Appl. No.: 283,487

[22] Filed: Aug. 1, 1994

Related U.S. Application Data

[63] Continuation of Ser. No. 19,809, Feb. 18, 1993, abandoned, which is a continuation of Ser. No. 527,204, May 23, 1990, abandoned.

[30] Foreign Application Priority Data

Apr. 13, 1990 [JP] Japan ................................ 2-098782

[51] Int. Cl.⁶ ............................................ G06F 12/08
[52] U.S. Cl. ............................................. 395/403
[58] Field of Search .......................... 364/200 MS File, 364/900 MS File; 395/425 MS File

[56] References Cited

U.S. PATENT DOCUMENTS

| | | | |
|---|---|---|---|
| 3,969,706 | 7/1976 | Proebsting et al. | 340/173 |
| 4,050,061 | 9/1977 | Kitagawa | 340/173 |
| 4,382,278 | 5/1983 | Appelt | 395/425 |
| 4,498,155 | 2/1985 | Mohan | 365/230.09 |
| 4,562,555 | 12/1985 | Oochi et al. | 365/230.09 |
| 4,577,293 | 3/1986 | Matick et al. | 365/189.04 |
| 4,649,516 | 3/1987 | Chung et al. | 395/250 |
| 4,725,945 | 2/1988 | Kronstadt et al. | 395/425 |
| 4,803,621 | 2/1989 | Kelly | 364/200 |
| 4,884,270 | 11/1989 | Chiu et al. | 365/189.07 |
| 4,888,773 | 12/1989 | Arlington et al. | 364/900 |
| 4,905,188 | 2/1990 | Chuang et al. | 364/900 |
| 4,912,630 | 3/1990 | Cochcroft, Jr. | 364/200 |
| 4,933,837 | 6/1990 | Freidin | 365/425 |
| 4,953,079 | 8/1990 | Ward et al. | 364/200 |
| 4,958,322 | 9/1990 | Kosugi et al. | 365/63 |
| 4,985,829 | 1/1991 | Thatte et al. | 395/425 |
| 5,025,421 | 6/1991 | Cho | 365/230.05 |
| 5,091,846 | 2/1992 | Sachs et al. | 364/DIG. 1 |
| 5,111,386 | 5/1992 | Fujishima et al. | 395/425 |
| 5,148,536 | 9/1992 | Witek et al. | 395/425 |
| 5,163,142 | 11/1992 | Mageau | 395/425 |
| 5,210,843 | 5/1993 | Ayers | 395/425 |

FOREIGN PATENT DOCUMENTS 62-38590  2/1987  Japan .

OTHER PUBLICATIONS

Asakura, et al. "An Experimental 1–Mbit Cache DRAM with ECC", IEEE Journal of Solid–State Circuits, vol. 25, No. 1, Feb. 1990.

*Primary Examiner*—Reba I. Elmore
*Attorney, Agent, or Firm*—Lowe, Price, LeBlanc & Becker

[57] ABSTRACT

A cache DRAM (100) includes a DRAM memory array (11) accessed by a row address signal and a column address signal, an SRAM memory array (21) accessed by the column address signal, and an ECC circuit (30). The DRAM memory array (11) is divided into a plurality of blocks (B1 to B64), each including a plurality of columns. The SRAM memory array (21) includes 4 ways (W1 to W4). In determining a cache hit/cache miss, a column address signal is inputted. Consequently, the SRAM memory array (21) is accessed and data are read from each of the ways. When a cache hit occurs, one way is selected in response to an externally applied way address signal, and data from that way are outputted. When a cache miss occurs, the column address signal is latched and the row address signal is applied. The DRAM array (11) is accessed in accordance with the row address signal and the latched column address signal.

35 Claims, 12 Drawing Sheets

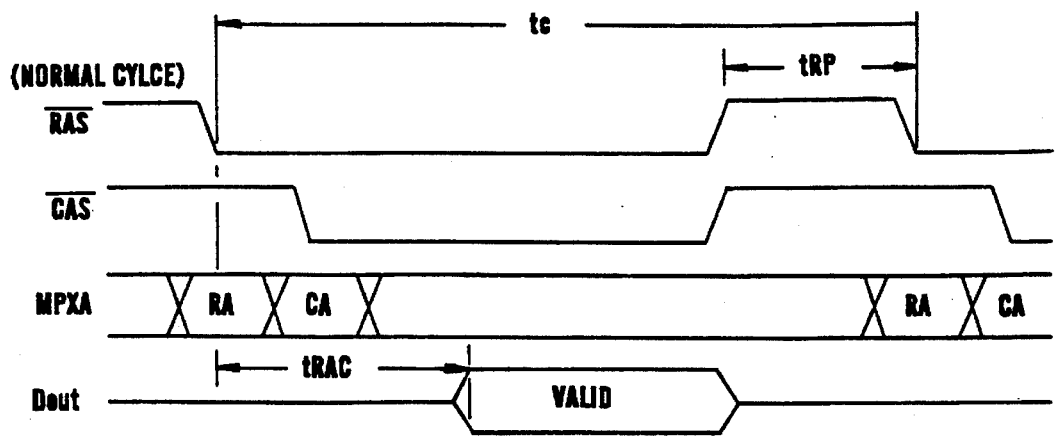
FIG. 10A PRIOR ART (NORMAL CYLCE)
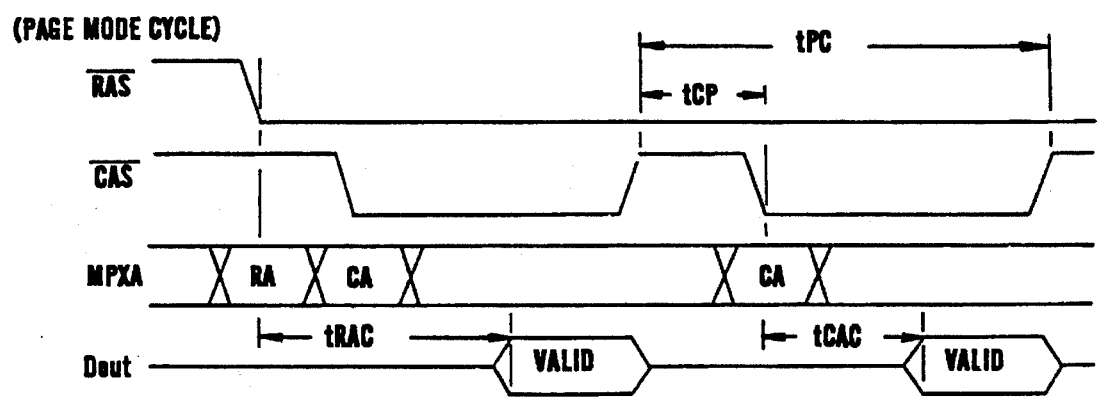
FIG. 10B PRIOR ART (PAGE MODE CYCLE)
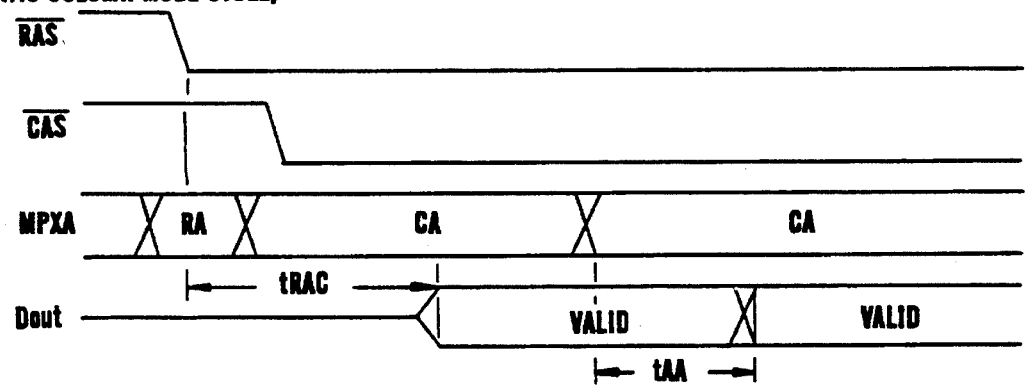
FIG. 10C PRIOR ART (STATIC COLUMN MODE CYCLE)

SEMICONDUCTOR MEMORY DEVICE HAVING AN SRAM AS A CACHE MEMORY INTEGRATED ON THE SAME CHIP AND OPERATING METHOD THEREOF

This application is a Continuation application of application Ser. No. 08/019,809, filed Feb. 18, 1993 now abandoned, which is a continuation of application Ser. No. 07/527,204, filed May 23, 1994 now abandoned.

CROSS-REFERENCE TO RELATED APPLICATIONS

This application is related to copending applications Ser. Nos. 228,589 filed Aug. 5, 1988, now U.S. Pat. No. 4,926,385, 248,712 filed Sep. 26, 1988, abandoned and continued as 542,682 on Jun. 25, 1990, 254,233 filed Oct. 6, 1988, now U.S. Pat. No. 4,952,164, 266,060 filed Nov. 2, 1988, abandoned and continued as 538,605 on Jun. 14, 1990, now U.S. Pat. No. 5,111,386, and 266,601 filed Nov. 3, 1988, abandoned and continued at 564,657 filed Aug. 9, 1990 commonly assigned with the present invention.

BACKGROUND OF THE INVENTION

1. Field of the Invention

The present invention relates to a semiconductor memory device and, more specifically, to a semiconductor memory device containing a cache memory in which a cache memory is integrated on the same chip.

2. Description of the Background Art

A main memory included in a computer system is formed of a dynamic random access memory (hereinafter referred to as DRAM) which has large capacity and slow speed of operation and is not very expensive. In order to improve cost-efficiency of the computer system, a high speed memory having smaller capacity is often provided as a high speed buffer between the main memory and a central processing unit (hereinafter referred to as CPU). The high speed buffer is called a cache memory. Blocks of data which are considered to be frequently used by the CPU are copied from the main memory and stored in the cache memory. If the data stored in an address which is to be accessed in the DRAM by the CPU also exist in the cache memory, it is called a cache hit. The CPU accesses the high speed cache memory to take the necessary data from the cache memory. Meanwhile, if the data stored in the address to be accessed by the CPU in the DRAM do not exist in the cache memory, it is called a cache miss. In that case, the CPU accesses the low speed main memory, takes the necessary data from the main memory and transfers a block including the data from the DRAM to the cache memory.

However, such a cache memory requires an expensive high speed memory. Therefore, it can not be used in a compact computer system in which lower cost is given priority. Therefore, a simple cache system has been formed by utilizing a page mode or a static column mode included in a general purpose DRAM.

FIG. 9 is a block diagram showing a basic structure of a conventional DRAM device in which a page mode or a static column mode is possible.

Referring to FIG. 9, a plurality of word lines and a plurality of bit line pairs are arranged intersecting with each other in a memory cell array 50, and memory cells are provided at respective intersections. In FIG. 9, one word line WL, one bit line pair BL, $\overline{BL}$, and one memory cell MC provided at the intersection of the word line WL and the bit line BL are shown as representatives.

Word lines in the memory cell array 50 are connected to a row decoder 53 through a word driver 52. Bit line pairs in the memory cell array 50 are connected to a column decoder 56 through a sense amplifier portion 54 and an I/O switch 55. A multiplexed signal MPXA in which a row address signal RA and a column address signal CA are multiplex is applied to the row address buffer 57 and the column address buffer 58. The row address buffer 57 applies a row address signal RA to the row decoder 53, and the column address buffer 58 applies a column address signal CA to the column decoder 56. Meanwhile, an output buffer 59 and an input buffer 60 are connected to the I/O switch 55.

Waveforms of operation in a common reading cycle, a page mode cycle and a static column mode cycle of the DRAM device are shown in FIGS. 10A, 10B and 10C, respectively. In the common reading cycle shown in FIG. 10A, first the row address buffer 57 takes the multiplexed address signal MPXA at a falling edge of a row address strobe signal $\overline{RAS}$ to apply the same as the row address signal RA to the row decoder 53. The row decoder 53 selects one of the plurality of word lines in response to the row address signal RA. The selected word line is activated by the word driver 52. Consequently, information stored in the plurality of memory cells connected to the word line is read to the corresponding bit lines, and the information is detected and amplified in the sense amplifier portion 54. At this time, information of memory cells of one row is latched in the sense amplifier portion 54.

Thereafter, the column address buffer 58 takes the multiplexed address signal MPXA at a falling edge of a column address strobe signal $\overline{CAS}$ to apply the same as the column address signal CA to column decoder 56. The column decoder 56 selects one of the information of one row latched in the sense amplifier portion 54 in response to the column address signal CA. The selected information is taken outside as output data Dout through the I/O switch 55 and the output buffer 59.

The access time (RAS access time) $t_{RAC}$ in this case corresponds to the time period from the falling edge of the row address strobe signal $\overline{RAS}$ until the-output data Dout becomes effective. The cycle time $t_C$ is a sum of the time in which the device is active and the time of RAS precharge $t_{RP}$. As a standard value, $t_C$ is about 200 ns when $t_{RAC}$=100 ns.

In the page mode cycle and the static column mode cycle shown in FIGS. 10B and 10C, memory cells on the same row are accessed by changing the column address signal CA. In the page mode cycle, the column address signal CA is latched at the falling edge of the column address strobe signal $\overline{CAS}$. In the static column mode cycle, access is done only by the change of the column address signal CA as in the static RAM (SRAM).

The CAS access time $t_{CAC}$ in the page mode cycle and the address access time $t_{AA}$ in the static column mode cycle are approximately ½ of the RAS access time $t_{RAC}$, which is about 50 ns when $t_{RAC}$=100 ns. In these cases, the cycle time also becomes shorter, and in the page mode cycle, it becomes about 50 ns as in the static column mode cycle, although it depends on the value of CAS precharge time $t_{CP}$.

FIG. 11 is a block diagram showing a structure of a simple cache system utilizing the page mode or the static column mode of the DRAM device shown in FIG. 9. FIG. 12 shows waveforms of operation of the simple cache system shown in FIG. 11.

Referring to FIG. 11, a main memory 21 is formed to have 1M byte by 8 DRAM devices 20, having 1M×1 bit structure. In this case, 20 ($2^{20}$=1048576=1M) address lines are necessary before the row address signal and the column address signal are multiplexed. However, since the row address signal RA and the column address signal CA are multiplexed by the address multiplexer 22, the number of the address lines actually connected to each DRAM devices 20 is 10.

The operation of the simple cache system shown in FIG. 11 will be described with reference to the waveforms of operation of FIG. 12.

First, 20 bits of address signals AD corresponding to the data necessary for the CPU 24 are generated by an address generator 23. A latch (tag) 25 maintains row address signals corresponding to the data selected in the last cycle. A comparator 26 compares 10 bits of row address signals RA out of the 20 bits of address signals AD with the row address signals maintained in the latch 25. If they coincide with each other, it means that the same row as in the last cycle is accessed in the present cycle. This is called a cache hit. In that case, the comparator 26 generates a cache hit signal CH.

A state machine 27 carries out a page mode control in which the column address strobe signal $\overline{CAS}$ is toggled while the row address strobe signal $\overline{RAS}$ is kept at a low level, in response to the cache hit signal CH. On this occasion, an address multiplexer 22 applies a column address signal CA to the DRAM devices 20 (see FIG. 12). Consequently, data corresponding to the column address signal CA is taken out of the data latched in the sense amplifier portion of each DRAM device 20. In this manner, when a cache hit occurs, output data can be provided at high speed with the access time $t_{CAC}$ from each DRAM device 20.

Meanwhile, if the row address signal RA generated from the address generator 23 does not coincide with the row address signal maintained in the latch 25, it means that the row accessed in the present cycle is different from that in the last cycle. It is called a cache miss.

In that case, the comparator 26 does not generate the cache hit signal CH. The state machine 27 carries out RAS/CAS control of a common reading cycle, and the address multiplexer 22 successively applies a row address signal RA and the column address signal CA to each DRAM device 20 (see FIG. 12). In this manner, when a cache miss occurs, a common reading cycle starting from precharging by the row address strobe signal $\overline{RAS}$ is started, the output data is provided slowly with the access time $t_{RAC}$. Therefore, the state machine 27 generates a wait signal Wait to set the CPU 24 in a wait state. When a cache miss occurs, the new row address signal RA is maintained in the latch 25.

In the simple cache system of FIG. 11, data of one row (1024 bits, when 1M×1 bit DRAM device is used) of each array block in each DRAM device 20 are latched as one data block in the sense amplifiers. Therefore, the size of the data block is larger than needed, which causes a shortage of the numbers of data blocks (entry numbers) maintained in the latch (tag) 25. For example, in the simple cache system shown in FIG. 11, the entry number is 1. Therefore, the rate of cache hit (cache hit rate) is low.

Recently, DRAM devices having memory capacity of 16M bit on 1 chip have come to be manufactured. It will make it possible to provide the whole capacity of the main memory by, 1 chip in a personal computer system or the like. In view of the foregoing, the number of parts will be increased at interfaces or the like when the conventional standard DRAM devices are used in incorporating to the memory system, which will generate problems such as delay of signal transfer, which is fast enough in the chip, due to the delay between chips.

Japanese Patent Laying Open No. 62-38590 discloses a semiconductor memory device in which a DRAM, an SRAM and means for transferring data of 1 row at one time between those memories on 1 chip are provided. In the semiconductor memory device, one row of the DRAM is 1 block, so that the size of the data block is larger than needed. Consequently, the number of blocks maintained in the tag portion (the number of entries) becomes smaller, and the cache hit rate becomes lower. Further, SRAM cells are provided for respective bit line pairs of the DRAM and the SRAM serving as the cache memory is in the DRAM array, and accordingly the access speed is low. The speed of access is approximately the same as the access speed when the static column mode or the first page mode of the DRAM is used.

SUMMARY OF THE INVENTION

An object of the present invention is to provide a semiconductor memory device containing a cache memory capable of forming a simple cache system having improved cache hit rate and higher cost efficiency, by providing data blocks of suitable size and by increasing the number of entries.

Another object of the present invention is to increase speed of operation of a semiconductor memory device containing a cache memory.

A further object of the present invention is to simplify control of controlling systems by decreasing the number of pins in the semiconductor memory device containing a cache memory.

A still further object of the present invention is to improve reliability of a semiconductor memory device containing a cache memory.

A still further object of the present invention is to provide a method of operation, enabling increase of access speed of the semiconductor memory device containing a cache memory.

A semiconductor memory device containing a cache memory formed on 1 chip comprises an address receiving portion for receiving multiplexed column address and row address signals, a dynamic type memory accessed in response to the row and column address signals, and a static type memory accessed in response to at least a portion of the column address signal.

In determining cache hit/cache miss, the static type memory is accessed in response to at least a portion of the column address from the address receiving portion. When a cache miss occurs, the dynamic type memory means is further accessed in response to the row address signal and the column address signal from the address receiving portion.

Since the semiconductor memory device contains a static type memory means which is accessed in response to at least a portion of the column address signal as a cache memory, a suitable sized data block can be provided, and the number of entry can be increased. This improves the cache hit rate.

In the semiconductor memory device, when cache hit/cache miss is determined, the static type memory means is accessed at first, regardless of the cache hit/cache miss, and accordingly, high speed access is possible when a cache hit occurs. The average access time can be made shorter.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10A is a diagram of waveforms showing a common read cycle of a DRAM device;

FIG. 10B is a diagram of waveforms showing a page mode cycle of the DRAM device;

FIG. 10C is a diagram of waveforms showing a static column mode cycle of the DRAM device;

DESCRIPTION OF THE PREFERRED EMBODIMENTS

Embodiments of the present invention will be described in detail in the following with reference to the figures.

Figure 1:
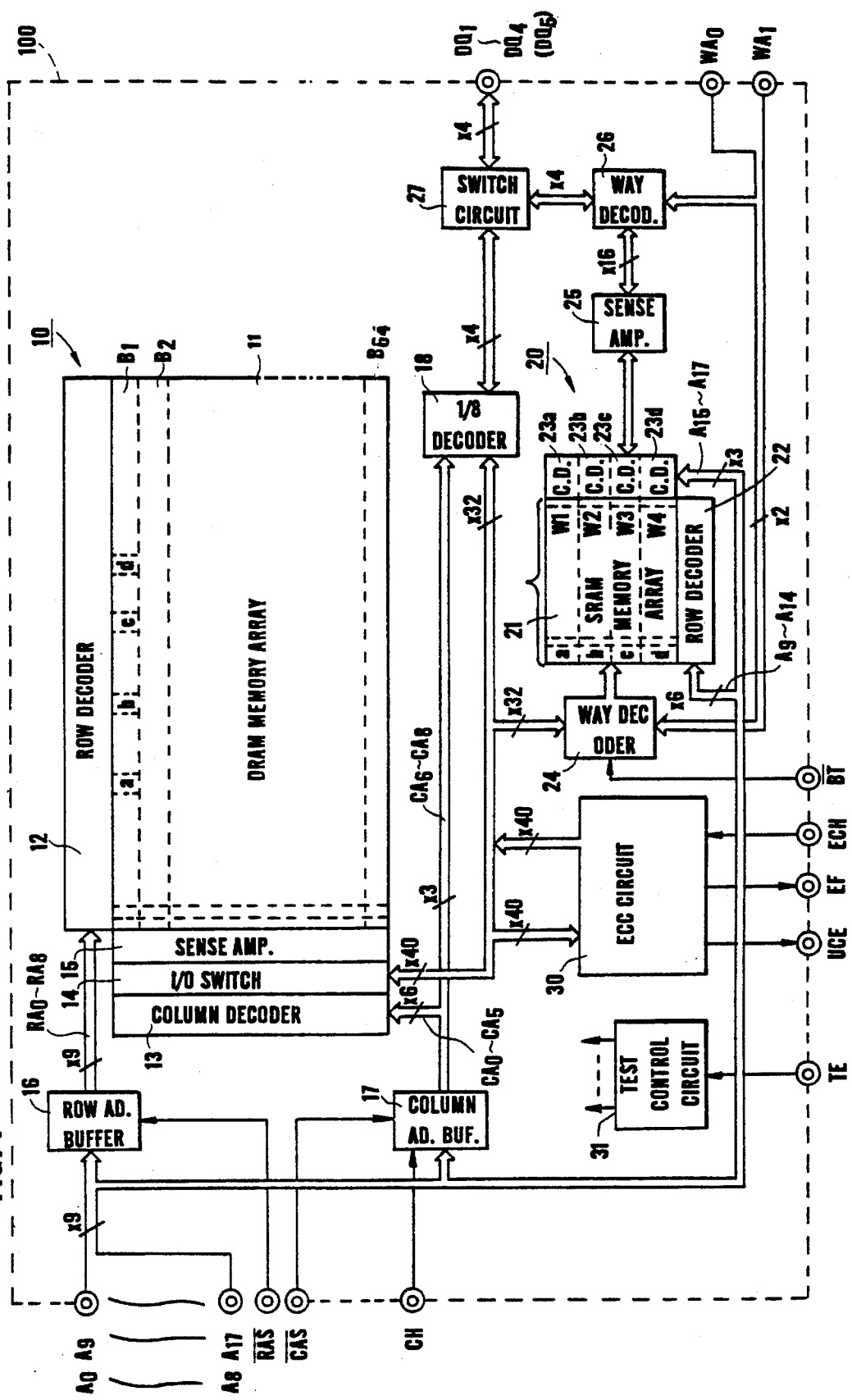
FIG. 1 is a block diagram showing a structure of a cache DRAM in accordance with one embodiment of the present invention.

FIG. 1 is a block diagram showing a structure of a DRAM device containing a cache memory (hereinafter referred to as a cache DRAM) in accordance with one embodiment of the present invention.

The cache DRAM 100 of FIG. 1 is formed on 1 chip. The cache DRAM 100 comprises a DRAM portion 10 serving as a main memory, a SRAM portion 20 serving as a cache memory, and an error check and correcting circuit (hereinafter referred to as an ECC circuit) 30 as means for ensuring reliability of the DRAM portion 10. The cache DRAM 100 further comprises a test controlling circuit 31 for controlling testing operation.

Figure 2:
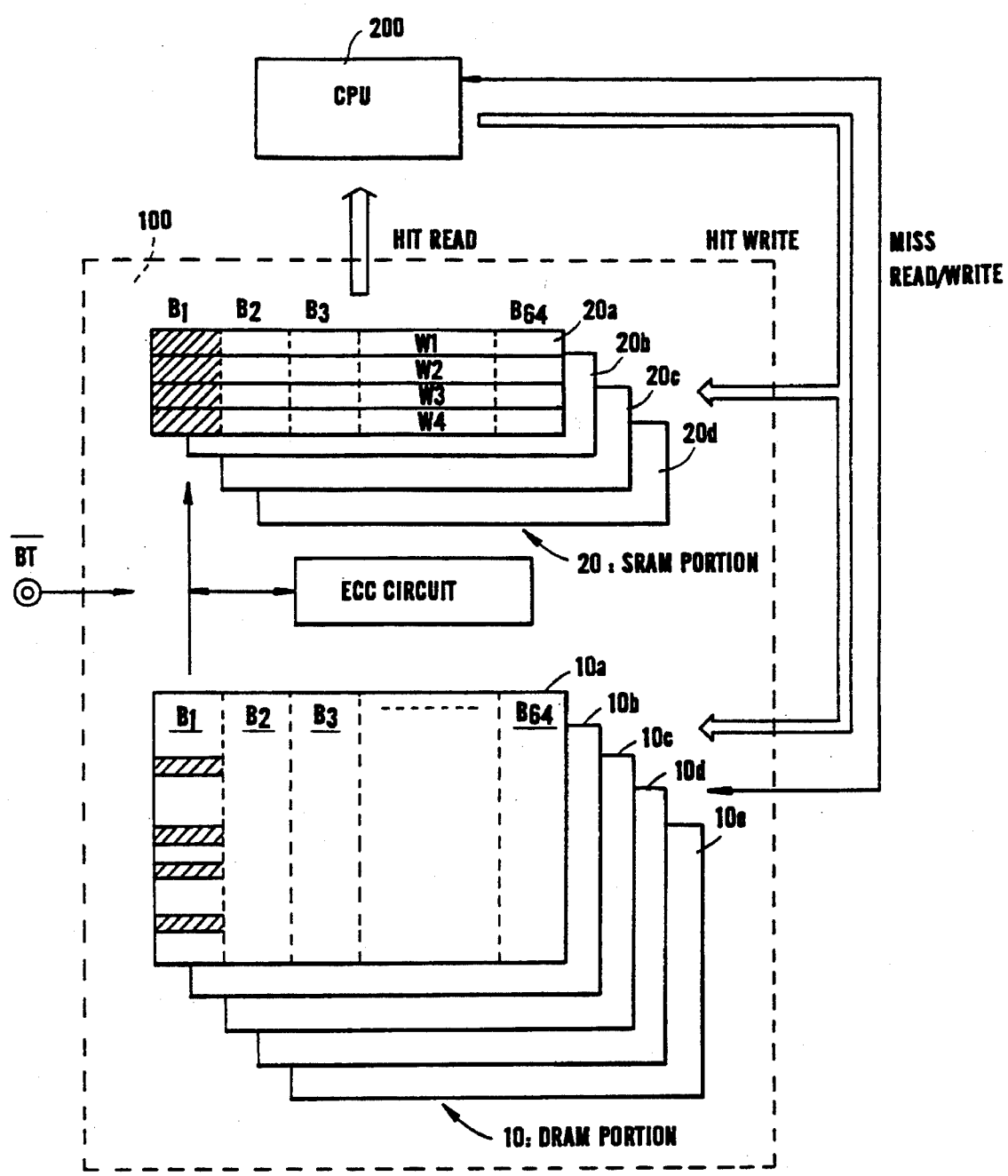
FIG. 2 shows basic operations of the cache DRAM of FIG. 1.

The DRAM portion 10 has ×4 bit structure having 4 bit input/output terminals, and the SRAM portion also has the ×4 bit structure. As shown in FIG. 2, the DRAM portion 10 comprises 4 data bit planes 10a, b, c and d of 256K bits corresponding to the ×4 bit structure, and 1 parity bit plane 10e of 256K bits for the ECC circuit 30. Only a portion corresponding to one data bit plane is shown in FIG. 1. The SRAM portion 20 comprises 4 memory planes 20a, b, c and d corresponding to the ×4 bit structure, as shown in FIG. 2. Only a portion corresponding to one memory plane is shown in FIG. 1.

Referring to FIG. 1, the DRAM memory array 11 comprises a plurality of dynamic type memory cells arranged in 256 rows and 256 columns. The DRAM memory array 11 is divided into 64 blocks B1 to B64 (64 sets) each having 8 columns. 8 bits of data stored in each row in each block constitute one data block. Meanwhile, the SRAM memory array 21 comprises a plurality of static type memory cells arranged in 64 rows and 32 columns. The SRAM memory array 21 is divided into 4 ways (W1 to W4) each having 8 columns. The data stored in each row in each way constitute one data block. Therefore, 64 data blocks (64 sets) are stored in each way.

In this manner, the SRAM portion 20 serving as the cache memory corresponds to the 4 way set associative system.

Data transfer from the DRAM memory array 11 to the SRAM memory array 21 is carried out data block by data block of 8 bits in each memory plane. Therefore, corresponding to four memory planes, total 32 bits of data are transferred at one time.

A multiplexed address signal is applied to the cache DRAM 100. Namely, the upper 9 bits of address signals A9 to A17 and the lower 9 bits of address signals A0 to A8 are time divisionally applied to the address input terminal. The row address buffer 16 applies the address signals A0 to A8 as row address signal RA0 to RA8 to the row decoder 12, in response to the row address strobe signal $\overline{RAS}$. Consequently, the row decoder 12 selects one row in the DRAM memory array 11. The column address buffer 17 applies the address signals A9 to A17 as column address signals CA0 to CA8 to the column decoder 13 and to a ⅛ decoder 18 in response to the column address strobe signal $\overline{CAS}$. The column decoder 13 selects one block in the DRAM memory array 11 in response to the column address signals CA0 to CA5.

In reading data, data blocks each having 8 bits selected by the row decoder 12 and the column decoder 13 are read through the sense amplifier 15 and the I/O switching portion 14. The ⅛ decoder 18 selects 1 bit in the data blocks each having 8 bits, and outputs the same to the outside through the switching circuit 27. Consequently, total 4 bits of data are outputted.

Meanwhile, the externally applied upper 9 bits of address signals A9 to A17 are also applied to the SRAM portion 20. The address signals A9 to A14 are applied to the row decoder 22. The address signals A15 to A17 are applied to four column decoders 23a, 23b, 23c and 23d provided corresponding to the four ways W1 to W4. The row decoder 22 selects one row in the SRAM memory array 21 in response to the address signals A9 to A14. Each of the column decoders 23a to 23d selects one column in the corresponding way in response to the address signals A15 to A17. Consequently, 1 bit data is read from each way.

Since there are four memory planes and each memory plane comprises four ways, total 16 bits of data are applied to the way decoder 26 through the sense amplifier 25. The way decoder 26 selects one way in each memory plane in response to externally applied way address signals WA0 and WA1. Consequently, four bits of data are externally outputted through the switching circuit 27.

In data transfer, the way decoder 24 selects one way in each memory plane of the SRAM portion 20 in response to the externally applied way address signals WA0 and WA1.

Consequently, the data block of 8 bits read from each data bit plane of the DRAM portion is transferred to the selected way of the corresponding memory plane in the SRAM portion 20. Consequently, total 32 bits of data are transferred from the DRAM 10 to the SRAM portion 20. The data transfer is carried out by lowering the externally applied control signal $\overline{BT}$ to the "L" level.

In data transfer, 40 bits including parity bits are read from the DRAM portion 10 to be applied to the ECC circuit 30. Error check and correction are carried out by the ECC circuit 30, and 32 bits of data out of the 40 bits are transferred to the SRAM portion 20. Which way of the SRAM portion 20 is to be selected as the destination of data transfer is determined dependent on the way address signals WA0 and WA1 generated based on a replacement logic.

Basic operation of the cache DRAM 100 will be described in the following with reference to FIG. 2.

The cache DRAM 100 carries out four basic operations, that is, hit read, hit write, miss read and miss write. In hit reading, data are read from the SRAM portion 20 to be applied to the CPU 200. In hit writing, data are written from the CPU 200 to the SRAM portion 20 and at the same time, data are written in corresponding bits of the DRAM portion 10. This is called a write through system.

In miss reading, data are read from the DRAM portion 10 to be applied to the CPU 200. At this time, the data block including the accessed bit in the DRAM portion 10 is transferred to the SRAM portion 20. The transfer in this case is controlled by the externally applied controlling signal $\overline{BT}$. In miss writing, data are written from the CPU 200 to the DRAM portion 10. Transfer/non-transfer of data to the SRAM portion 20 can be arbitrarily selected.

Figure 3:
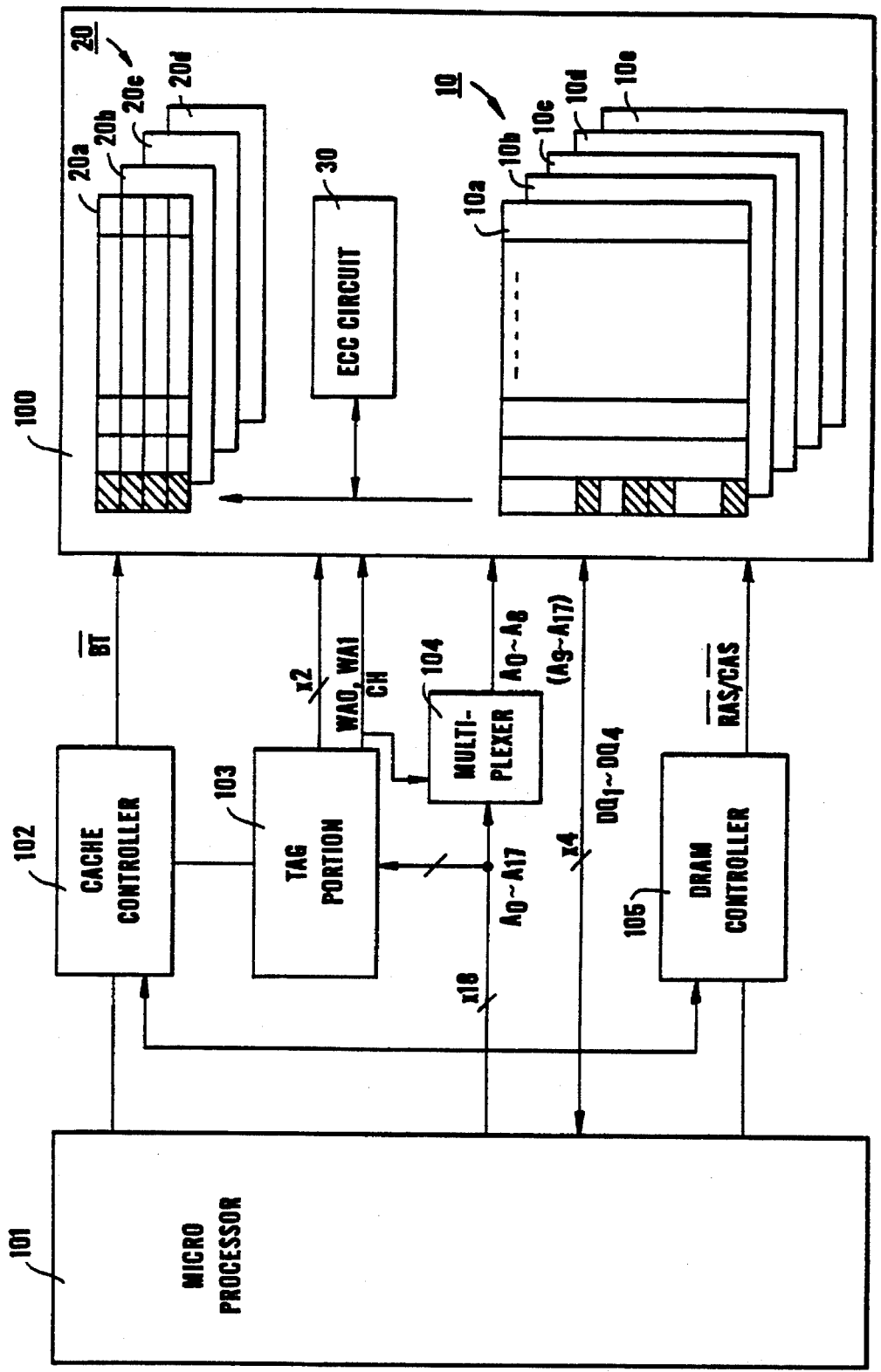
FIG. 3 is a block diagram showing a structure of a simple cache system using the cache DRAM of FIG. 1.
Figure 4:
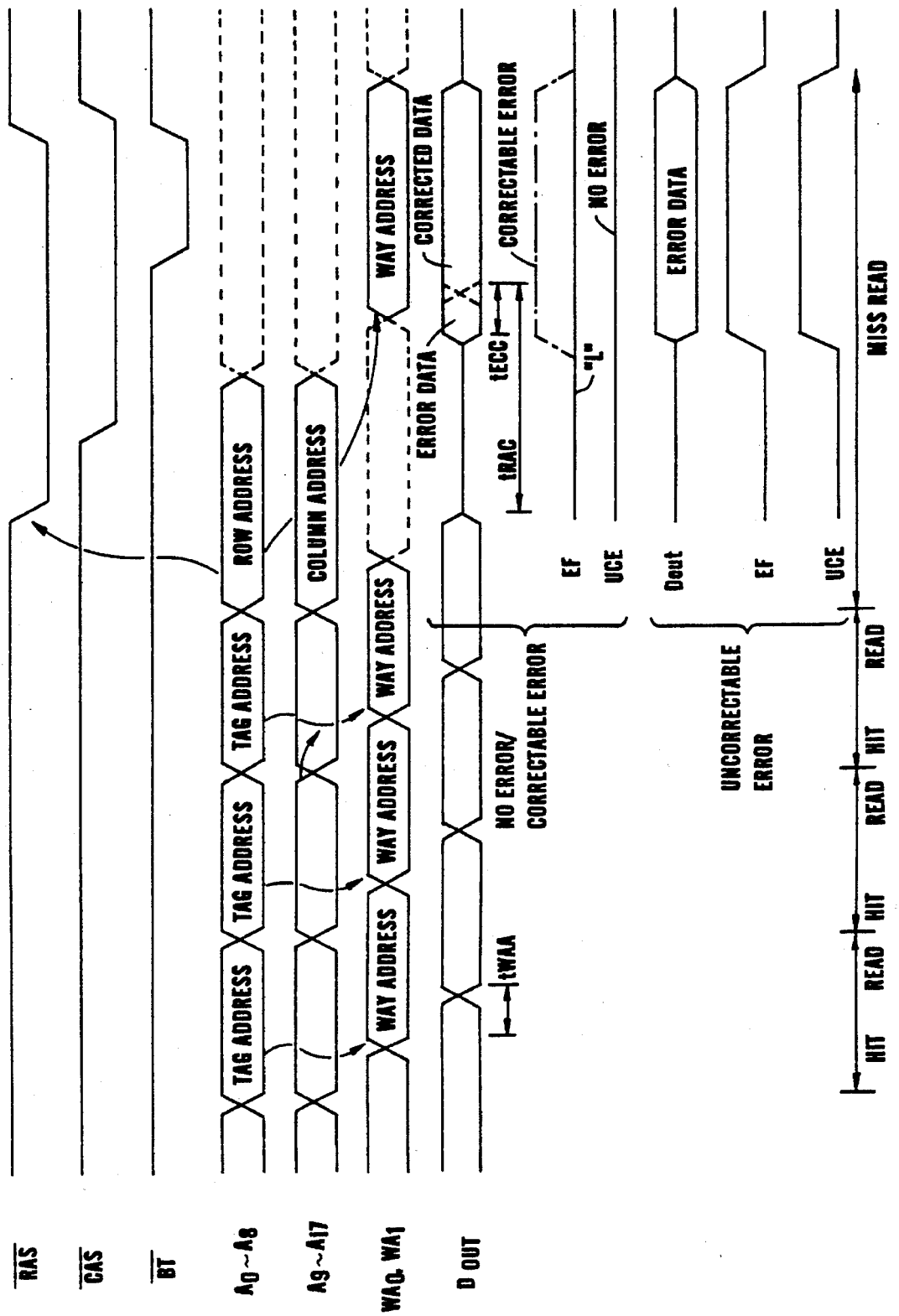
FIG. 4 is a diagram of waveforms showing the operation of the simple cache system of FIG. 3.

FIG. 3 is a block diagram showing a structure of a simple cache system using the cache DRAM 100 shown in FIG. 1. FIG. 4 is a diagram of waveforms of the simple cache system shown in FIG. 3.

Referring to FIG. 3, the tag portion 103 comprises a tag memory, a comparator and a replacement logic executing portion. 64 sets of row address signals RA0 to RA8 are stored as tag addresses in the tag portion 103. Each set comprises four sets of tag addresses corresponding to four ways W1 to W4.

A microprocessor 101 generates address signals A0 to A17. The address signals A0 to A8 are inputted as tag addresses, and the address signals A9 to A14 are inputted as set addresses, to the comparator of the tag portion 103. The comparator compares the four sets of row address signals RA0 to RA8 (entry addresses) stored in the corresponding sets of the set addresses A9 to A14 with the inputted address signals A0 to A8. When the address signals A0 to A8 coincide with any of the four sets of row address signals RA0 to RA8, the way address signals WA0 and WA1 corresponding to the row address signals RA0 to RA8 are outputted, and a "H" level cache hit signal CH is outputted.

While comparison is done by the comparator of the tag portion 103, the address signals A9 to A17 are inputted to the SRAM portion 20 in the cache DRAM 100 as cache addresses by the multiplexer 104, and the SRAM portion 20 is accessed at the same time. Consequently, 16 bits of data of 4 ways corresponding to the address signals A9 to A17 are outputted to the way decoder 26 (FIG. 1).

If a cache hit occurs in the cycle, the way address signals WA0 and WA1 are outputted from the tag portion 103, as shown in FIG. 4. In response to the way address signals WA0 and WA1, one way of the four ways W1 to W4 is selected by the way decoder 26. Consequently, total 4 bits of data are externally outputted through the switching circuit 27 (FIG. 1). In this manner, high speed access is realized when a cache hit occurs.

If a cache miss occurs in that cycle, access to the DRAM portion 10 is done in accordance with the row address strobe signal $\overline{RAS}$ and the column address strobe signal $\overline{CAS}$ generated from the DRAM controller 105. In that case, the cache hit signal CH attains to the "L" level. The column address buffer 17 shown in FIG. 1 latches the address signals A9 to A17 applied from the multiplexer 104, in response to the "L" level cache hit signal CH.

Then, the multiplexer 104 applies the address signals A0 to A8 to the cache DRAM 100. The row address buffer 16 applies the address signals A0 to A8 as row address signals RA0 to RA8 to the row decoder 12 in response to the fall of the row address strobe signal $\overline{RAS}$. Thereafter, the column address buffer 17 applies the latched address signals A9 to A17 to the column decoder 13 and to the ⅛ decoder 18 as column address signals CA0 to CA8, in response to the fall of the column address strobe signal $\overline{CAS}$. Consequently, data blocks of 8 bits are read from the data bit planes.

Total 32 bits of data read from four data bit planes 10a to 10d are transferred together with 8 bits of check bits read from a check bit plane 10e to the ECC circuit 30.

If there is no error or a correctable error in the transferred data, a flag UCE maintains "L" level as shown in FIG. 4. If there is no error, a flag EF maintains the "L" level, and if there is a correctable error, the flag EF rises to the "H" level. If there is an error which can not be transferred in the transferred data, the flags UCE and EF rise to the "H" level. In that case, the data including error Dout are outputted. Data transfer in miss reading and miss writing from the DRAM portion 10 to the SRAM portion 20 is controlled by a controlling signal $\overline{BT}$ provided from a cache controller 102.

The address signals A0 to A8 and A9 to A17 shown in FIG. 4 represent address signals outputted from a micro processor 101.

In the embodiment of FIG. 1, 1 bit is selected at random based on the column address signals CA6 to CA8 out of the data block of 8 bits read from each data bit plane. If a shift register is provided in the ⅛ decoder 18, data blocks each having 8 bits can be successively read at very high speed by a snap mode, by toggling the column address strobe signal $\overline{CAS}$.

Figure 5:
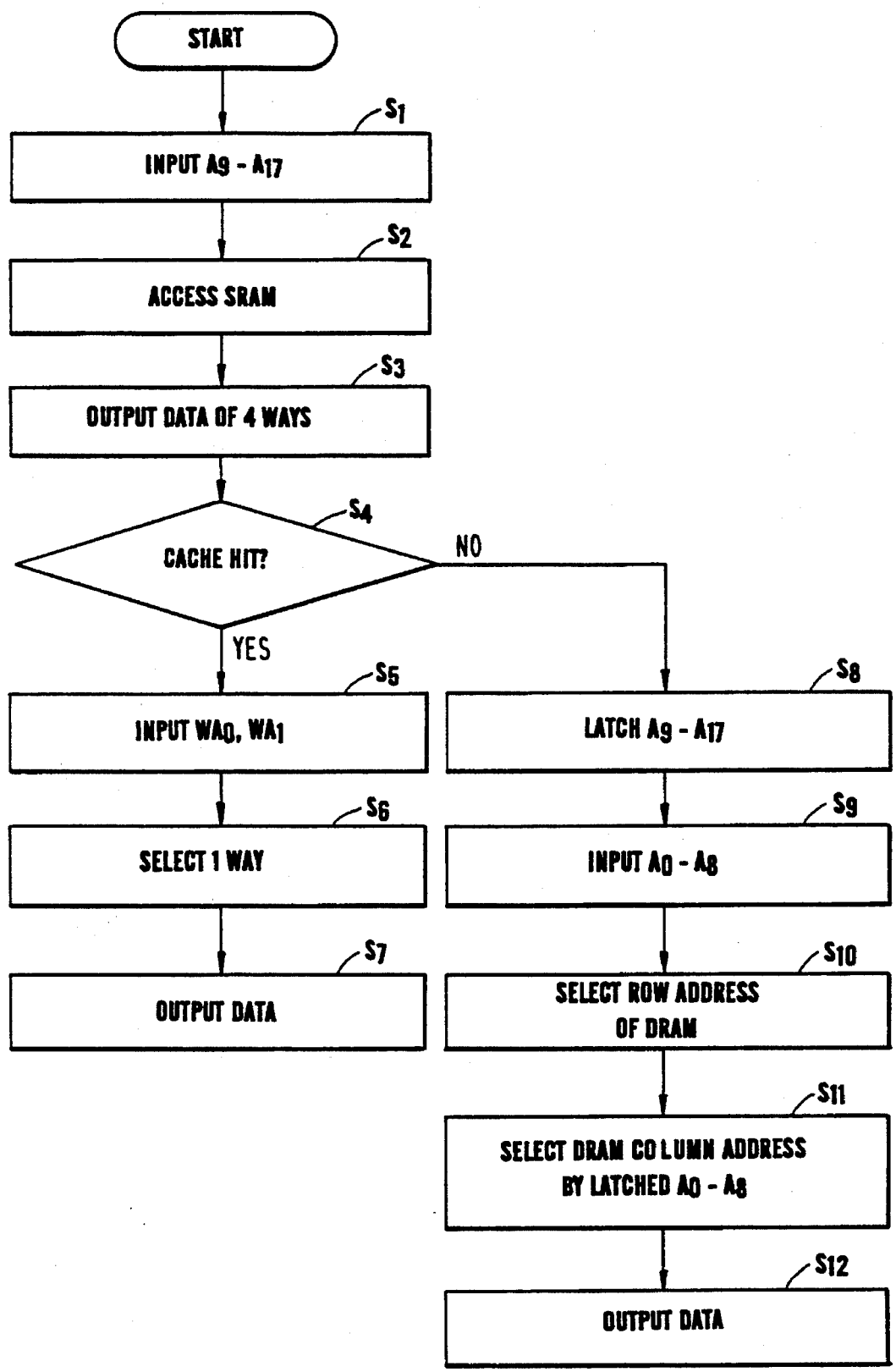
FIG. 5 is a flow chart showing a specific operation of the cache DRAM shown in FIG. 1.

As described above, the cache DRAM 100 shown in FIG. 1 carries out a unique operation to receive the multiplexed address signals. This operation will be briefly described with reference to the flow chart of FIG. 5.

First, address signals A9 to A17 corresponding to the column address signals are inputted to the cache DRAM 100 (step S1). Consequently, the SRAM portion 20 is accessed (step S2), and the data of 4 ways are outputted (step S3). When a cache hit occurs, the way address signals WA0 and WA1 are inputted (steps S4, S5). Consequently, one way is selected (step S6) and the data are outputted from that way (step S7).

When a cache miss occurs, the address signals A9 to A17 are latched (step S8). Then, address signals A0 to A8 corresponding to the row address signals are inputted (step S9). Consequently, the row address in the DRAM portion 10 is selected (step S10). Then, the column address of the DRAM portion 10 is selected in accordance with the latched address signals A0 to A8 (step S11). In this manner, data at the selected address are outputted (step S12).

In this manner, when a cache miss occurs, the address signals A9 to A17 corresponding to the column address signals are inputted and thereafter the address signals A9 to A8 corresponding to the row address signals are inputted. This order of input is reverse to that for accessing the DRAM portion 10. In this embodiment, means for latching the address signals A9 to A17 is provided in order to effectively utilize the address signals A9 to A17 which are inputted at first, and after the successively inputted address signals A9 to A17 are taken, the latched address signals A9 to A17 are made valid. Consequently, it becomes unnecessary to input the row address signals and the column address signals again in that order when the cache miss occurs, complicated control by the peripheral controllers becomes unnecessary and the access time is reduced.

Multiplication of the address signals matches very well with the operation of the cache DRAM 100, which reduces the number of pins and simplifies the control in the controlling system, whereby providing a simple structure.

Figure 6:
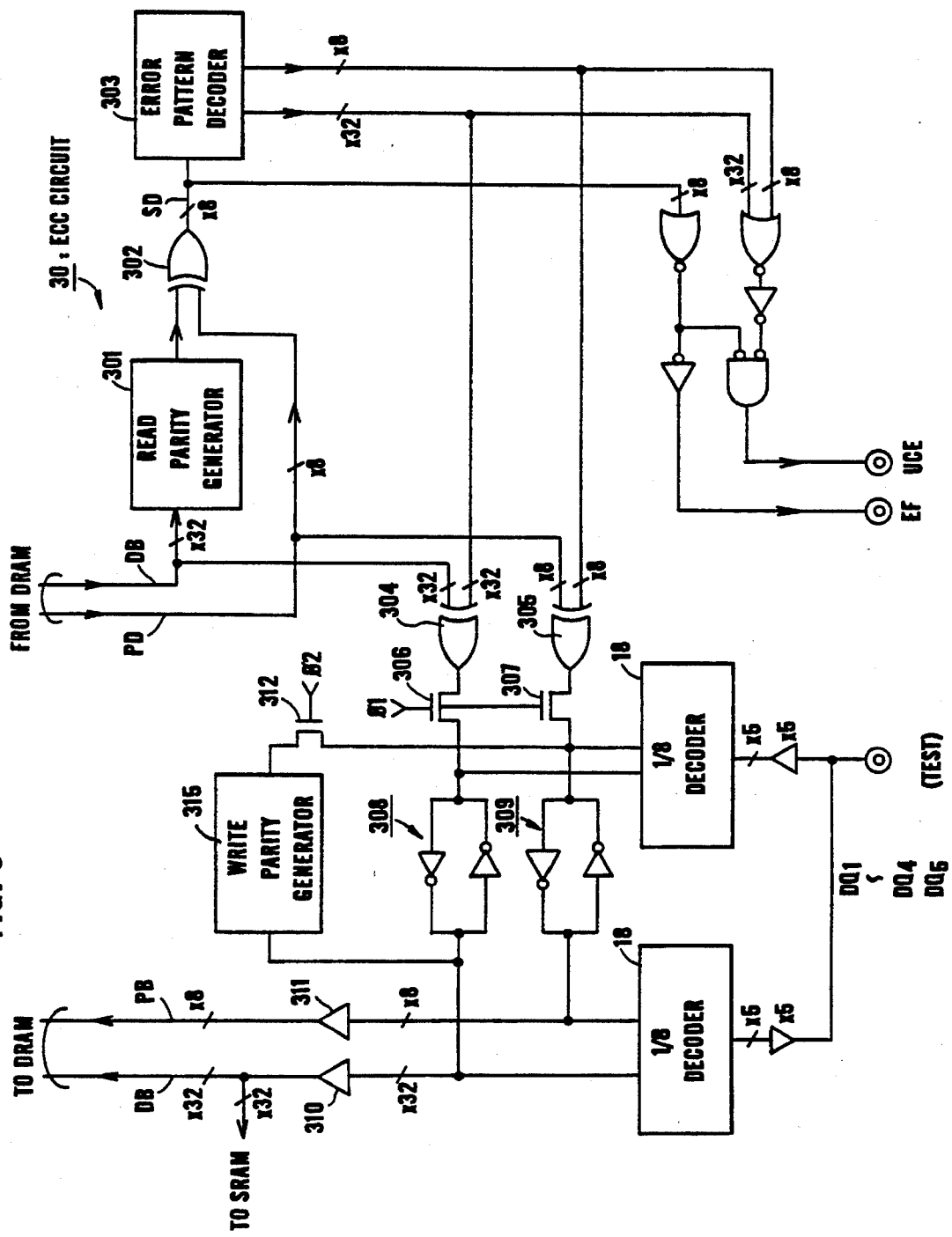
FIG. 6 is a block diagram showing one example of an ECC circuit included in the cache DRAM of FIG. 1.

FIG. 6 shows a structure of the ECC circuit 30.

In the reading operation, 32 bits of data bits DB and 8 bits of parity bits PB are read from the DRAM portion 10. The data bits DB of 32 bits are inputted to the read parity generator 301. An exclusive OR between the output from the read parity generator 301 and the parity bits PB of 8 bits is provided by an exclusive OR circuit 302, and a syndrome SD is generated. The syndrome SD includes information indicative of a defective bit out of the total 40 bits of the data bits DB including 32 bits and the parity bits PB including 8 bits. Based on the syndrome SD, a signal of 40 bits is generated, designating the bit to be corrected, by an error pattern decoder 303.

An exclusive OR between the signal outputted from the error pattern decoder 303 and the bit read from the DRAM portion 10 is provided by exclusive OR circuits 304 and 305. The error is corrected in this manner. The error corrected bit is written to the DRAM portion 10 through transistors 306, 307, inverters 308 and 309 and buffers 310 and 311 to which a signal φ1 is applied. If data are to be transferred to the SRAM portion 20, 32 bits of data bits DB out of the corrected 40 bits are also written in the SRAM portion 20.

If there is an error, the flag EF is outputted to an external terminal. If there is an uncorrectable error, the uncorrectable error flag UCE is outputted to the external terminal.

In the writing operation, the reading operation is carried out at first in the same manner as described above. 4 bits out of the error corrected 32 bits of data bits DB are rewritten by the data DQ1 to DQ4 which are applied from the external terminal. The data bits DB of 32 bits which are newly rewritten are inputted to a write parity generator 315. The write parity generator 315 newly generates 8 bits of parity bits PB. The newly generated 32 bits of data bits DB and the 8 bits of parity bits PB, that is, total 40 bits, are written to the DRAM portion 10.

In the ECC circuit 30 shown in FIG. 6, a SEC-DED (Single Error Correction and Double Error Detection) code having 1 word formed of total 40 bits of 32 bits of data bits DB and 8 bits of parity bits PB is used as the ECC code. The ECC circuit 30 operates in all cycles in which the DRAM portion 10 operates. Namely, the ECC circuit 30 operates in the hit write cycle, miss read cycle, miss write cycle and a $\overline{CAS}$ before $\overline{RAS}$ refresh cycle. Therefore, an arbitrary 1 bit error out of 40 bits (1 word) can be corrected, and arbitrary 2 bits of error can be detected.

In the read cycle and in the $\overline{CAS}$ before $\overline{RAS}$ refresh cycle, an operation similar to that in the read modify write cycle is carried out inside. In the write cycle, the internal operation is basically the same as that of the read modify write cycle.

The cache DRAM 100 shown in FIG. 1 has some test functions related to the ECC function. When an external test signal TE is applied, the cache DRAM 100 is set to a test mode by a test controlling circuit 31. In the test mode, the parity bit plane 10e in the DRAM portion 10 can be directly accessed. Namely, the parity bits for the ECC circuit 30 can be read or written in the same manner as the data bit. Therefore the cache DRAM 100 can be tested as a DRAM having 256K×5 bit structure.

In the cache DRAM 100, whether or not the ECC circuit 30 is to be made effective can be controlled based on an externally applied controlling signal ECH to check the ECC circuit 30. For example, the ECC circuit 30 is once made invalid to write an arbitrary error data, and then the ECC circuit 30 is made valid to read the data. By checking whether or not the read data are properly corrected as expected, whether or not the ECC circuit 30 operates properly can be determined.

Figure 7:
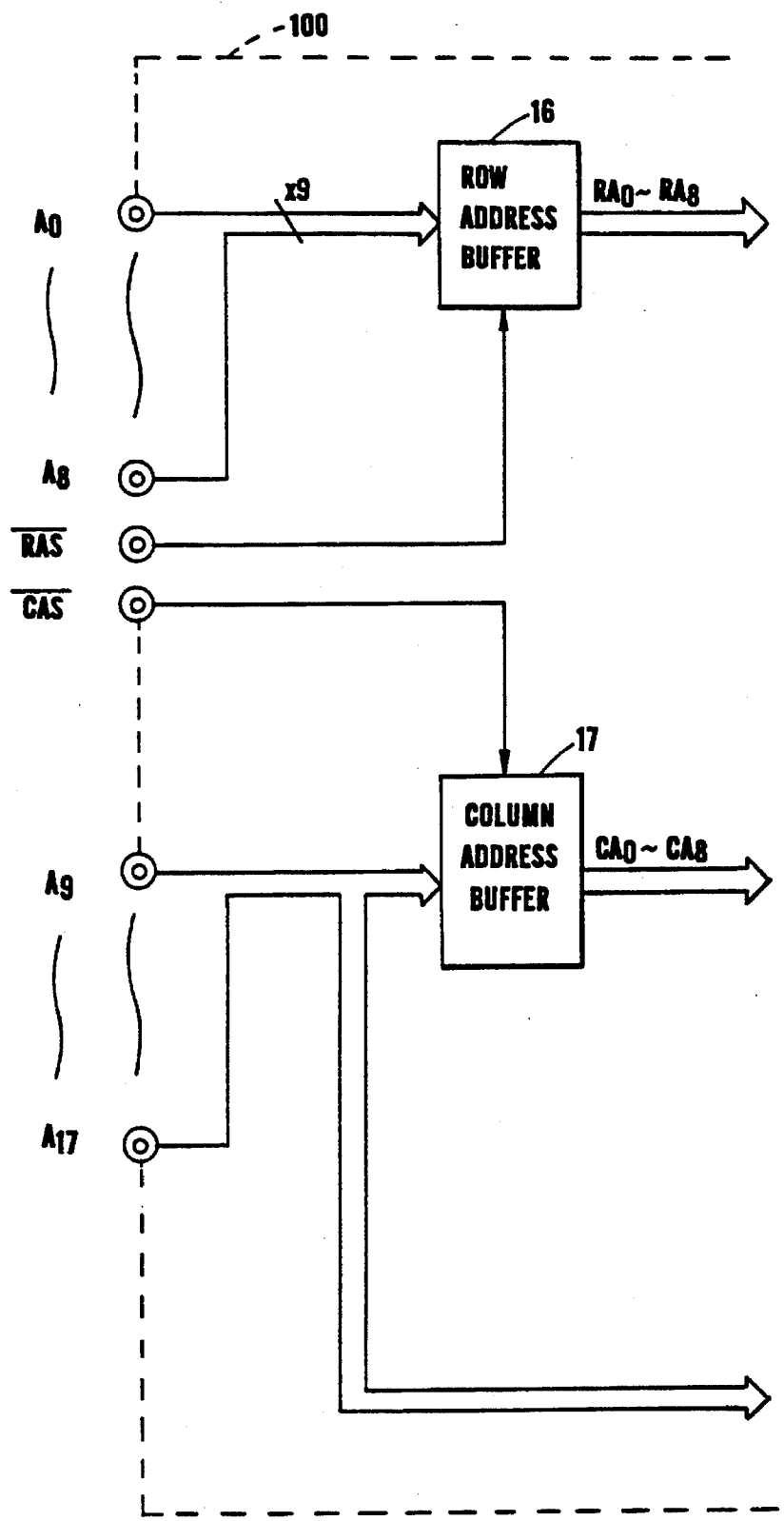
FIG. 7 is a block diagram showing a partial structure of a cache DRAM in accordance with another embodiment of the present invention.

FIG. 7 is a block diagram showing a structure of a portion of the cache DRAM 100 in accordance with another embodiment of the present invention.

In the cache DRAM 100 of FIG. 7, address terminals receiving the address signals A0 to A8 and address terminals receiving the address signals A9 to A17 are provided separately. The address signals A0 to A8 are applied to the row address buffer 16 and the address signals A9 to A17 are applied to a column address buffer 17. The cache DRAM 100 shown in FIG. 7 can operate in response to non-multiplexed address signals.

Figure 8:
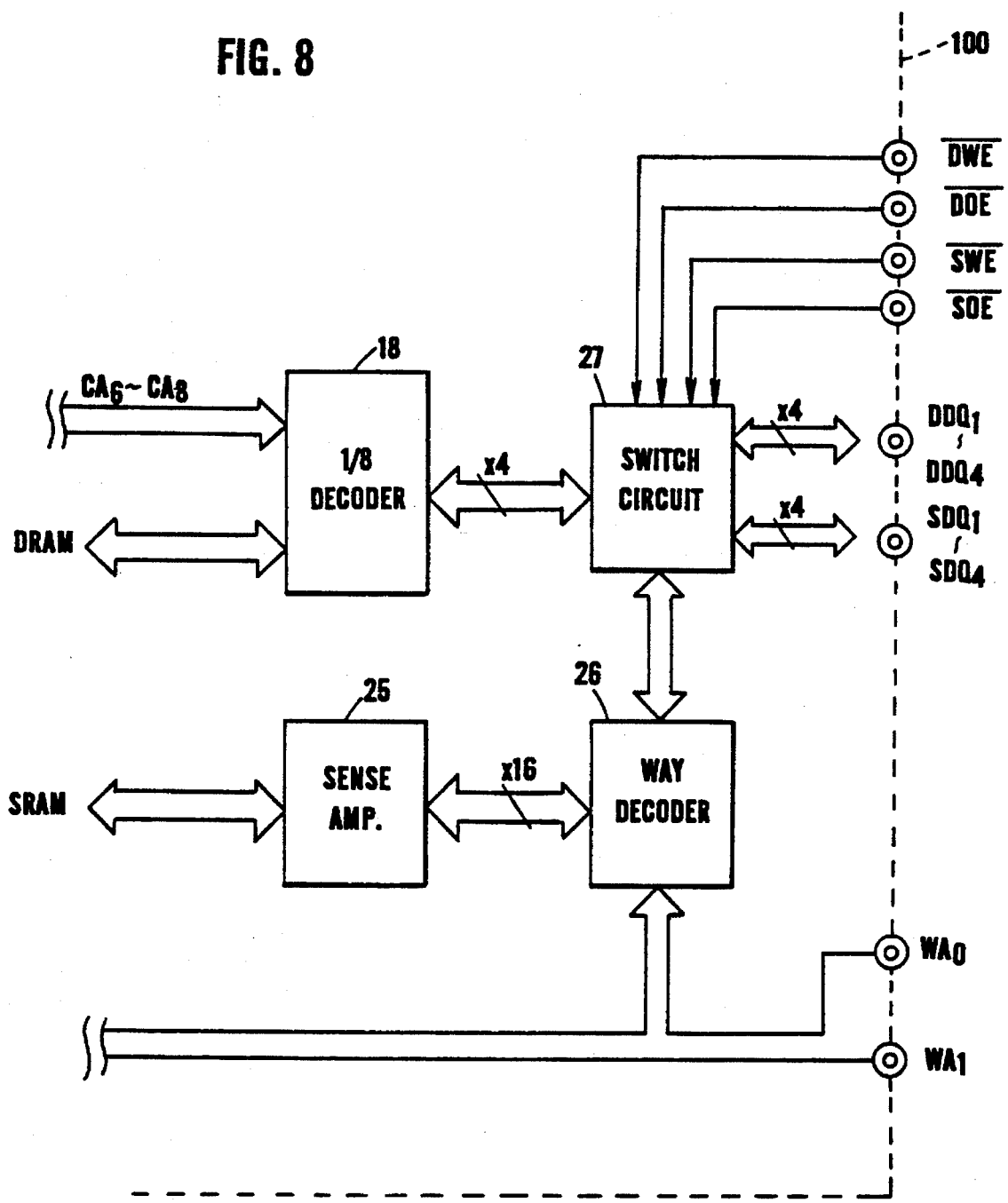
FIG. 8 is a block diagram showing a partial structure of a cache DRAM in accordance with a further embodiment of the present invention.
Figure 9:
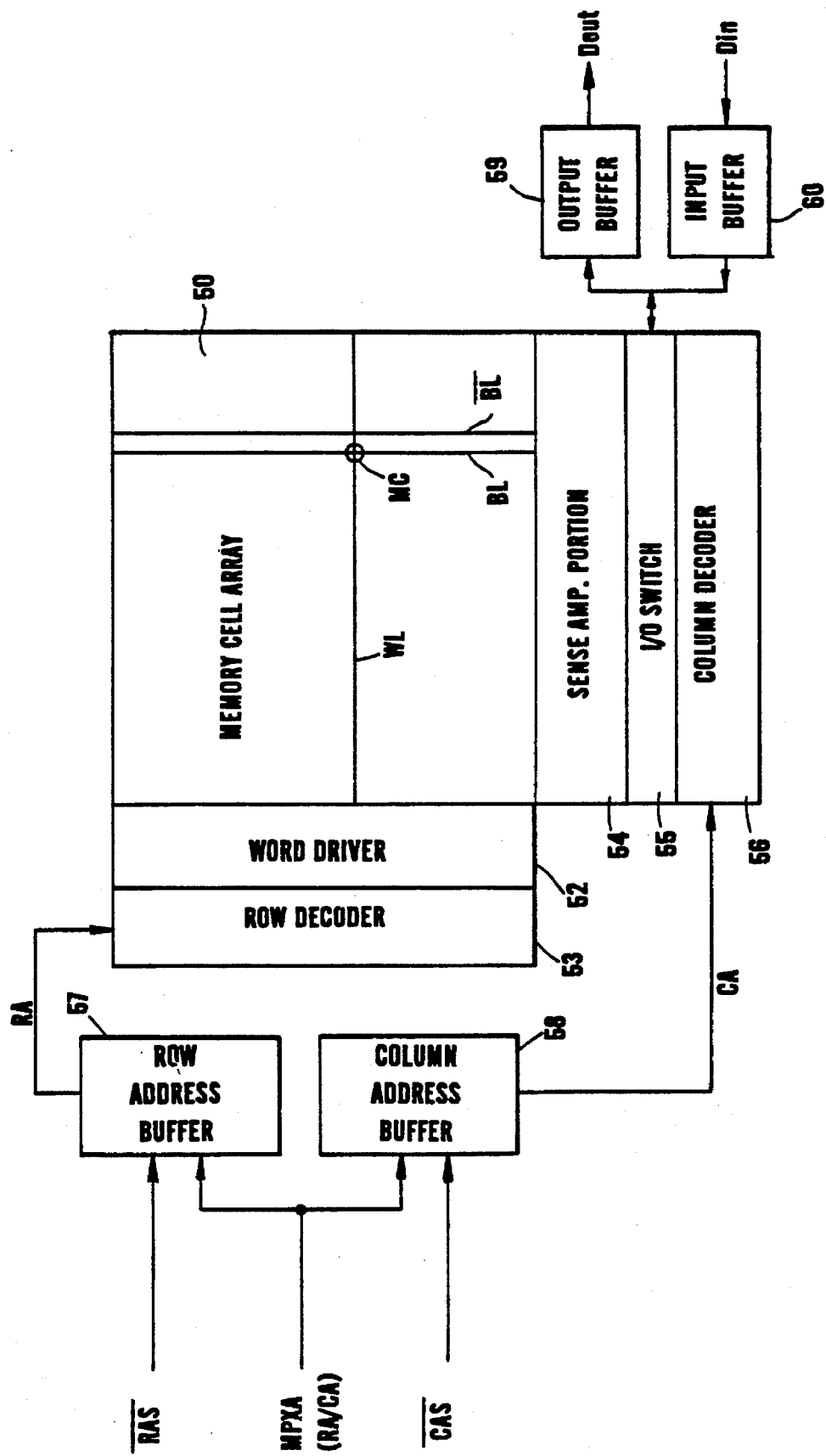
FIG. 9 is a block diagram showing one example of a structure of a conventional DRAM device.
Figure 11:
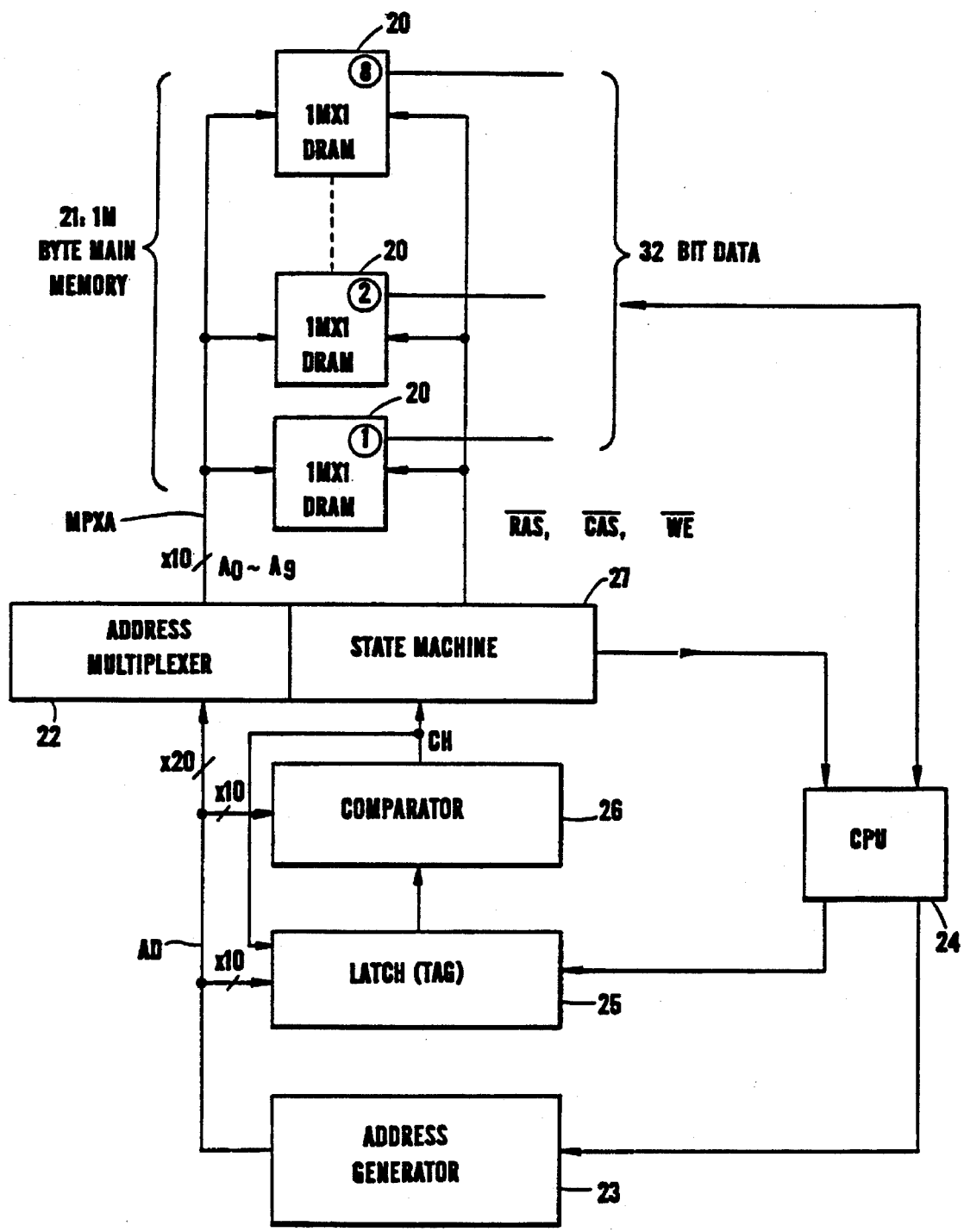
FIG. 11 is a block diagram showing a structure of a simple cache system using the DRAM device of FIG. 9.
Figure 12:
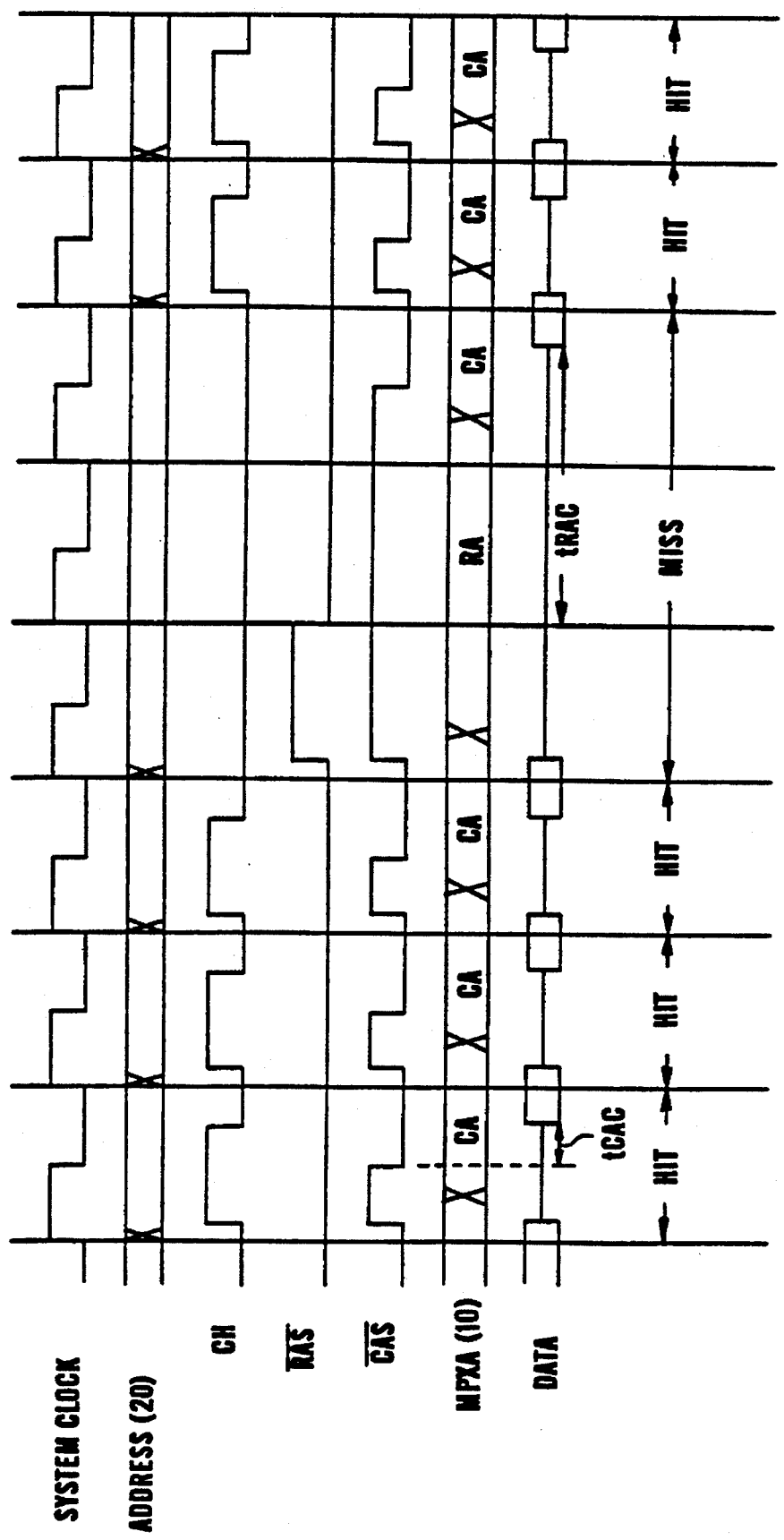
FIG. 12 is a diagram of waveforms showing the operation of the simple cache system shown in FIG. 11.

FIG. 8 is a block diagram showing a structure of a portion of the cache DRAM 100 in accordance with a further embodiment of the present invention. In the cache DRAM 100 of FIG. 8, terminals for receiving input/output data DDQ1 to DDQ4 for the DRAM portion (not shown) and terminals for receiving input/output data SDQ1 to SDQ4 for the SRAM portion (not shown) are provided separately. The switching circuit 27 is controlled by a DRAM write enable signal $\overline{DWE}$, DRAM output enable signal $\overline{DOE}$, SRAM write enable signal $\overline{SWE}$ and a SRAM output enable signal $\overline{SOE}$.

Switching between the writing and reading operations of the DRAM portion is controlled by the write enable signal $\overline{DWE}$, and the output of the data read from the DRAM portion is controlled by the output enable signal $\overline{DOE}$. The reading and writing operations of the SRAM portion is controlled by the write enable signal $\overline{SWE}$, and the output of the data read from the SRAM portion is controlled by the output enable signal $\overline{SOE}$.

In the cache DRAM 100 of FIG. 8, the DRAM portion and the SRAM portion can be controlled asynchronously. Therefore, the cache DRAM 100 can be used as a dual port memory. Consequently, transfer of data to the CPU and transfer of data to the system bus can be carried out separately. This avoids contention of buses, and the open rate of the system buses can be improved.

In the cache DRAM 100 shown in FIGS. 1, 7 and 8, actual layout on the chip is very important in further reducing the access time of the DRAM portion. As shown in FIGS. 1 and 8, the speed of operation can be further increased by arranging the SRAM portion 20 and the output circuit thereof near the input/output terminal.

As described above, the cache DRAM 100 of the above described embodiments contains an SRAM as a cache memory, so that average access time can be improved. Since a plurality of data blocks can be transferred at one time by utilizing an internal bus, a bottle neck of the input/output circuits between the main memory and the cache memory can be avoided. Consequently, high speed data transfer becomes possible. In addition, since the ECC function is included, reliability of the DRAM can be ensured.

As described above, in accordance with the present invention, since a static type memory means is contained as a cache memory, the size of the data block becomes proper and the number of entries can be increased. This improves the cache hit rate, and accordingly, a simple cache system having high cost efficiency can be provided.

Since the static type memory means is accessed based on a portion of the column address signal at first regardless of the cache hit or cache miss, the access time when the cache hit occurs can be reduced, and therefore the average access time can be reduced. Accordingly, a less expensive simple cache system having high operation speed can be provided.

Since multiplexed address signals can be used, the number of pins can be reduced, and the control by the controlling systems can be made simple.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device containing a cache memory formed on one chip, comprising:

address receiving means including an address input terminal for receiving multiplexed column address signals and row address signals, said column address signals being applied to said address input terminal prior to said row address signals;

dynamic type memory means to be accessed in response to said row address signal and said column address signal, said dynamic type memory means including a plurality of blocks of memory cells arranged in rows and columns;

static type memory means forming a cache memory accessed in response to a cache address and concurrently with performance of a cache hit/miss determination, said cache address being determined from at least a portion of said column address signals, said static type memory including a plurality of blocks of memory cells arranged in at least one row and in columns corresponding to said columns of said dynamic type memory means; and accessing means for accessing said static type memory means in response to at least a portion of said column address signal from said address receiving means in performing said cache hit/cache miss determination, and for further accessing the dynamic type memory means in response to said row address signal and said column address signal from said receiving means when a cache miss occurs, wherein said cache address and row address signals are multiplexed.

2. The semiconductor memory device according to claim 1, wherein said address receiving means further comprises:
      holding means for holding the column address signal, and
      said address receiving means including means for (i) applying said portion of said column address signal to said static memory means, (ii) supplying said column address signal to said holding means, (iii) applying the row address signal to said dynamic memory means, and (iv) applying said column address signal held in said holding means to said dynamic type memory means.

3. The semiconductor memory device according to claim 1, wherein said dynamic type memory means (10) comprises:
      a memory array (11) including a plurality of memory cells arranged in a plurality of rows and a plurality of columns;
      first row selecting means (12) for selecting any of said plurality of rows in response to said row address signals; and
      first column selecting means (13, 18) for selecting any of said plurality of columns in response to said column address signal: and
   said static type memory means (20) comprises:
      at least one memory region (21) including a plurality of memory cells arranged in a plurality of rows and a plurality of columns;
      second row selecting means (22) for selecting any of said plurality of rows in said each memory region (21) in response to a portion of said column address signal, said portion being less than an entirety of said column address signal; and
      second column selecting means (23a to 23d) for selecting any of said plurality of columns in said each memory region (21) in response to a remaining portion of said column address signal.

4. The semiconductor memory device according to claim 3, wherein said at least one memory region (21) includes a plurality of memory subregions (W1 to W4),
   said semiconductor device further comprising:
      memory region selecting means (24, 26) for selecting any of said plurality of memory subregions (W1 to W4) in response to a selecting signal.

5. The semiconductor memory device according to claim 4, further comprising:

transfer means (14, 24) for transferring accessed data in said dynamic memory means (10) to said static type memory means (20) in response to a cache miss condition.

6. The semiconductor memory device according to claim 5, wherein said memory array (11) is divided into a plurality of blocks (B1 to B64) each including a plurality of columns,
   said first column selecting means includes block selecting means (13) for selecting any one of said plurality of blocks (B1 to B64) in response to a portion of said column address signal, and third column selecting means (18) for selecting one column of the block selected by said block selecting means (13) in response to the remaining of said column address signal,
   the number of columns in said each memory region (W1 to W4) is the same as the number of columns in said each block, and
   said transfer means (14, 24) transfers data of one row in the one block selected by said block selecting means (14) and said first row selecting means (12) in said dynamic type memory means (10) to one row selected by said second row selecting means (22) in a selected one of said memory subregions.

7. A semiconductor memory device according to claim 1, further comprising:

error check and correction means (30) for checking and correcting an error in data read from said dynamic type memory means (10) and supplying the resulting corrected data to said static type memory means.

8. The semiconductor memory device according to claim 7, wherein said error check and correction means (30) further comprises parity bit generating means (301, 315) for generating a parity bit for error check and correction, and said dynamic type memory means (10) further comprises a parity bit storing region (10e) for storing the parity bit generated by said error check and correction means (30).

9. A semiconductor memory device according to claim 8, further comprising:

test mode setting means (31) for setting said semiconductor memory device to a test mode; and test mode accessing means for accessing said parity bit storing region (10e) of said dynamic type memory means (10) in said test mode.

10. The semiconductor memory device according to claim 7, further comprising:

means for suppressing an operation of said error check and correction means.

11. A semiconductor memory device according to claim 1, further comprising:

an input/output terminal for inputting or outputting data; and switching means (27) for selectively coupling said dynamic type memory means (10) and said static type memory means (20) to said input/output terminal.

12. A semiconductor memory device according to claim 11, wherein said static type memory means (20) is arranged near said input/output terminal.

13. A semiconductor memory device according to claim 11, further comprising:

an output circuit (25, 27) for said static type memory means (20), said output circuit (25, 27) arranged near said input/output terminal.

14. A semiconductor memory device according to claim 1, further comprising:

a first input/output terminal for inputting or outputting data for said dynamic type memory means (10) and a second input/output terminal for inputting or outputting data for said static type memory means (20), wherein said dynamic type memory means (10) and said static type memory means (20) are accessed asynchronously.

15. The semiconductor memory device according to claim 12, wherein said static type memory means (20) is arranged near said second input/output terminal.

16. A semiconductor memory device according to claim 12, further comprising an output circuit (25, 27) for said static type memory means (20), said output circuit (25, 27) arranged near said input/output terminal.

17. The semiconductor memory device according to claim 1 wherein said accessing means comprises:

(i) a tag memory including a plurality of groups of memory cells arranged in at least one row and in columns corresponding to said columns of said dynamic type memory means, and (ii) comparison means responsive to said portion of said column address signal for comparing (a) row address data stored in a column of said tag memory with (b) said column address signal, and, in response, supplying a cache hit/miss signal.

18. The semiconductor memory device according to claim 1 further comprising data transfer means for transferring data from a selected one of said blocks of said dynamic type memory means to a selected block of said static type memory means of a column corresponding to said selected block of said dynamic type memory means.

19. The semiconductor memory device according to claim 1 further comprising data transfer means including a data bus having a number of signal lines equal to a number of memory cells contained in each of said blocks for selectively transferring data in parallel from a selected one of said blocks of said dynamic memory means to a selected block of said static type memory means, said selected blocks of said static type memory means and said selected one of said blocks of dynamic type memory means being located in corresponding columns of said respective memories.

20. The semiconductor memory device according to claim 1 wherein said blocks of said static type memory are arranged in a plurality of rows and said static type memory includes means responsive to another portion of said column address signal for selectively supplying data from a selected one of said blocks accessed in response to said portion of said column address signal.

21. The semiconductor memory device according to claim 1, wherein all the column address signals are used to access the cache memory.

22. A method of operating a semiconductor memory device containing, on one chip, a cache memory, having address receiving means including an address input terminal for receiving multiplexed column address signals and row address signals, a dynamic type memory means to be accessed in response to the row address signals and the column address signals and a static type memory means forming said cache memory to be accessed in response to a cache address determined from at least a portion of said column address signals, said cache address being multiplexed with the row address signal, said method comprising the steps of:

inputting said column address signals to said address input terminal;

holding said column address signals and accessing said static type memory means in response to at least a portion of said column address signals concurrently with determining a cache hit/cache miss condition;

reading data from said static type memory means in a cache hit condition; and accessing said dynamic type memory means in response to said held column address signals and to said row address signals in a cache miss condition.

23. An operating method according to claim 22, further comprising the step of transferring data provided by the access to the dynamic type memory means (10) to the static type memory means (20) in response to said cache miss condition.

24. A semiconductor memory device containing a cache memory formed on one chip, comprising:

an address input terminal receiving multiplexed column address signals and row address signals, said column address signals being applied to said address input terminal prior to said row address signals;

column address receiving means for receiving and holding said column address signals from said address input terminal;

dynamic type memory means to be accessed in response to said row address signals and said column address signals;

static type memory means forming a cache memory to be accessed in response to a cache address and concurrently with a cache hit/cache miss determination, said cache address determined from at least a portion of said column address signals; and accessing means for accessing said static type memory means in response to said cache address when a cache hit occurs, and for further accessing said dynamic type memory means in response to said column address signals from said column address receiving means and said row address signals, wherein said cache address and row address signals are multiplexed.

25. A semiconductor memory device according to claim 24, wherein said dynamic type memory means (10) comprises:
   a memory array (11) including a plurality of memory cells arranged in a plurality of rows and a plurality of columns;
   first row selecting means (12) for selecting any of said plurality of rows in response to said row address signals; and
   first column selecting means (13, 18) for selecting any of said plurality of columns in response to said column address signal: and
said static type memory means (20) comprises:
   at least one memory region (21) including a plurality of memory cells arranged in a plurality of rows and a plurality of columns;
   second row selecting means (22) for selecting any of said plurality of rows in said each memory region (21) in response to a portion of said column address signals; and
   second column selecting means (23a to 23d) for selecting any of said plurality of columns in said each memory region (21) in response to at least a portion of remaining said column address signal.

26. A semiconductor memory device comprising:

an address input terminal receiving multiplexed column address signals and row address signals, said column address signals being applied to said address input terminal prior to said row address signals;

a DRAM portion on a chip forming a main memory having
   (i) a plurality of DRAM type memory cells arranged in rows and columns,
   (ii) a row decoder responsive to said row address signals for selecting a plurality of said DRAM type memory cells arranged in a row, and
   (iii) a column decoder responsive to said column address signals for selecting a plurality of said DRAM type memory cells arranged in a column; and a SRAM portion on said chip forming a cache memory having
   (i) a plurality of SRAM type memory cells arranged in rows and columns,
   (ii) a row decoder responsive to a cache row address signal determined from a portion of said column address signals for selecting a plurality of said SRAM type memory cells arranged in a row, and
   (iii) a column decoder responsive to a cache column address signal determined from the remaining portion of said column address signals for selecting a plurality of said SRAM type memory cells arranged in a column, wherein said cache address and row address signals are multiplexed.

27. A memory system comprising:

an address input terminal receiving multiplexed column address signals and row address signals, said column address signals being applied to said address input terminal prior to said row address signals;

dynamic type memory means to be access in response to said row address signals and said column address signals, said dynamic type memory means including a plurality of blocks of memory cells arranged in rows and columns;

static type memory means forming a cache memory to be accessed in response to a cache address determined from at least a portion of said column address signals, said static type memory including a plurality of blocks of memory cells arranged in at least one row and in columns corresponding to said columns of said dynamic type memory means; and access means for accessing said static type memory means in response to said cache address concurrently with determining cache hit/cache miss, and for further accessing the dynamic type memory means in response to said row address signals and said column address signals when a cache miss occurs, said accessing means including
   (i) a tag memory receiving said row address signals and including a plurality of groups of memory cells arranged in at least one row and in columns corresponding to said columns of said dynamic type memory means, and
   (ii) comparison means for comparing row address data stored in a column of said tag memory with said row address signals and, in response, supplying a cache hit/miss signal, wherein said cache address and row address signals are multiplexed.

28. A semiconductor memory device, comprising:

a main memory array having a plurality of main memory blocks each including a plurality of main memory cells arranged in rows and columns;

a row decoder for a main memory for selecting, based on a row address for the main memory, a main memory cell arranged on a prescribed row from the plurality of main memory blocks in said main memory array;

a column decoder for a main memory for selecting, based on a column address for the main memory, a main memory cell arranged in a prescribed main memory block from said main memory array;

a cache memory array having a plurality of cache memory blocks each having a plurality of cache memory cells arranged in same number of rows as the number of said main memory blocks and same number of columns as the columns of each said main memory block;

a row decoder for a cache memory for selecting, based on a row address for the cache memory, a cache memory cell arranged on a prescribed row of the cache memory block in said cache memory array; and a column decoder for a cache memory for selecting, based on a column address signal for the cache memory, a cache memory cell arranged on a prescribed column of the cache memory block in said cache memory array.

29. The semiconductor memory device according to claim 28, further comprising a way decoder receiving a way address signal and outputs from respective ones of the plurality of cache memory blocks, for selecting and providing an output from that cache memory block which corresponds to the way address signal.

30. The semiconductor memory device according to claim 28, wherein
the row address signal for the cache memory is same as a part of the column address signal for the main memory, and rows in the cache memory block correspond to respective main memory blocks in the main memory array.

31. The semiconductor memory device according to claim 30, including an address signal input pin to which the row address signal for the main memory and the column address signal for the main memory are commonly applied.

32. The semiconductor memory device according to claim 31, comprising
column address holding means receiving a cache hit signal and the column address signal for the main memory applied to the address input pin prior to the row address signal for the main memory, for holding, when the cache hit signal indicates a cache miss, said column address signal for the main memory applied to said address input pin, and after said row address signal for the main memory applied to said address input pin is applied to the row decoder for the main memory, applying said held column address signal for the main memory to the column decoder for the main memory.

33. A semiconductor memory device, comprising:
an address signal input pin to which a row address signal for a main memory and a column address signal for a main memory are commonly applied;
a main memory array including a plurality of main memory cells arranged in rows and columns;
a row decoder for the main memory for selecting, based on said row address signal for the main memory, a main memory cell arranged on a prescribed row of said main memory array;
a column decoder for the main memory for selecting, based on said column address signal for the main memory, a main memory cell arranged on a prescribed column of said main memory array;
a cache memory array including a plurality of cache memory cells arranged in rows and columns;
a row decoder for the cache memory for selecting, based on a row address signal for the cache memory consisting of a part of said column address signal for the main memory, a cache memory cell arranged on a prescribed row of said cache memory array;
a column decoder for the cache memory for selecting, based on a column address signal for the cache memory consisting of a part of said column address signal for the main memory, a cache memory cell arranged on a prescribed column of said cache memory array; and
column address latch means receiving a cache hit signal and the column address signal for the main memory applied to the address input pin prior to the row address signal for the main memory, for latching, when the cache hit signal indicates a cache miss, said column address signal for the main memory applied to said address input pin, and after said row address signal for the main memory applied to said address input pin is applied to the row decoder for the main memory, for applying said latched column address signal for the main memory to the column decoder for the main memory.

34. A cache system, comprising:
a semiconductor memory device, including
an address signal input pin to which a row address signal for a main memory and a column address signal for a main memory are commonly applied,
a main memory array having a plurality of main memory blocks each including a plurality of main memory cells arranged in rows and column,
a row decoder for the main memory for selecting, based on a row address signal for the main memory, a main memory cell arranged on a prescribed row from the plurality of main memory blocks of said main memory array,
a column decoder for the main memory for selecting, based on a column address signal for the main memory, a main memory cell arranged in a prescribed main memory block from said main memory array,
a cache memory array having a plurality of cache memory blocks each including a plurality of cache memory cells arranged in rows corresponding to respective main memory blocks and in same number of columns as the columns in each said main memory block,
a row decoder for a cache memory for selecting, based on a row address signal for the cache memory which is same as a part of said row address signal for the main memory, a cache memory cell arranged on a prescribed row of the cache memory block in said cache memory array, and
a column decoder for the cache memory for selecting, based on a column address signal for the cache memory, a cache memory cell arranged on a prescribed column of the cache memory block in said cache memory array;
a plurality of tag memories provided corresponding to respective cache memory blocks, having a plurality of tag memory cells and receiving a row address signal for a cache memory, for providing an entry row address signal which is identical to a row address signal for a main memory corresponding to a main memory cell arranged at a prescribed row in a main memory block corresponding to a cache row designated by said row address signal for the cache memory of the main memory array of said semiconductor memory device, in which main memory cell, same data as stored in said cache row of the corresponding cache memory block of said semiconductor device is stored, which entry row address signal being stored in a tag memory cell corresponding to said row address signal for the cache memory; and
a comparator receiving the entry row address signal provided from each said tag memory and the row address signal for the main memory, for providing a cache hit signal which indicates a cache hit when at least one of said entry row address signals coincides with said row address signal for a main memory, and indicates a cache miss when said row address signal for a main memory does not coincide with any of said entry row address signals.

35. A method of reading data from a semiconductor memory device including a main memory array having a plurality of main memory cells arranged in rows and columns; a row decoder for the main memory for selecting, based on a row address signal for the main memory, a main memory cell arranged on a prescribed row of said main memory array; a column decoder for the main memory for selecting, based on a column address signal for a main memory, a main memory cell arranged on a prescribed column of said main memory array, said column address signal for the main memory being applied to an address input pin prior to application of said row address signal for the main memory; a cache memory array having a plurality of cache memory cells arranged in rows and columns; a row decoder for the cache memory for selecting, based on a row address signal for a cache memory, a cache memory cell arranged on a prescribed row of said cache memory array; and a column decoder for the cache memory for selecting, based on a column address signal for a cache memory, a cache memory cell arranged on a prescribed column of said cache memory array; comprising the steps of:

applying said row address signal for the cache memory and said column address signal for the cache memory to said semiconductor memory device;

applying a cache hit signal indicating a cache hit or a cache miss to said semiconductor memory device; and applying, when said cache hit signal indicates a cache miss, the row address signal for the main memory to said semiconductor memory device.

* * * * *